United States Patent
Farley et al.

(10) Patent No.: US 9,558,914 B2
(45) Date of Patent: Jan. 31, 2017

(54) BIPOLAR WAFER CHARGE MONITOR SYSTEM AND ION IMPLANTATION SYSTEM COMPRISING SAME

(71) Applicant: Axcelis Technologies, Inc., Beverly, MA (US)

(72) Inventors: Marvin Farley, Ipswich, MA (US); Takao Sakase, Rowley, MA (US); Joseph Foley, Swampscott, MA (US)

(73) Assignee: AXCELIS TECHNOLOGIES, INC., Beverly, MA (US)

(*) Notice: Subject to any disclaimer, the term of this patent is extended or adjusted under 35 U.S.C. 154(b) by 16 days.

(21) Appl. No.: 14/631,066

(22) Filed: Feb. 25, 2015

(65) Prior Publication Data
US 2016/0247664 A1 Aug. 25, 2016

(51) Int. Cl.
*H01J 37/08* (2006.01)
*H01J 37/304* (2006.01)
*H01J 37/317* (2006.01)
*H01J 37/32* (2006.01)

(52) U.S. Cl.
CPC .......... *H01J 37/304* (2013.01); *H01J 37/3171* (2013.01); *H01J 37/32412* (2013.01); *H01J 2237/0203* (2013.01); *H01J 2237/304* (2013.01); *H01J 2237/31701* (2013.01)

(58) Field of Classification Search
None
See application file for complete search history.

(56) References Cited

U.S. PATENT DOCUMENTS

| | | | | |
|---|---|---|---|---|
| 5,136,171 A | * | 8/1992 | Leung | H01J 37/3171 250/251 |
| 5,315,145 A | * | 5/1994 | Lukaszek | H01L 22/14 257/317 |
| 6,653,852 B1 | * | 11/2003 | Benjamin | H01L 22/34 324/750.3 |
| 7,800,083 B2 | * | 9/2010 | Vanderberg | H01J 37/026 250/251 |

(Continued)

*Primary Examiner* — Andrew Smyth
(74) *Attorney, Agent, or Firm* — Eschweiler & Associates, LLC

(57) ABSTRACT

A charge monitor having a Langmuir probe is provided, wherein a positive and negative charge rectifier are operably coupled to the probe and configured to pass only a positive and negative charges therethrough, respectively. A positive current integrator is operably coupled to the positive charge rectifier, wherein the positive current integrator is biased via a positive threshold voltage, and wherein the positive current integrator is configured to output a positive dosage based, at least in part, on the positive threshold voltage. A negative current integrator is operably coupled to the negative charge rectifier, wherein the negative current integrator is biased via a negative threshold voltage, and wherein the negative current integrator is configured to output a negative dosage based, at least in part, on the negative threshold voltage. A positive charge counter and a negative charge counter are configured to respectively receive the output from the positive current integrator and negative current integrator in order to provide a respective cumulative positive charge value and cumulative negative charge value associated with the respective positive charge and negative charge.

8 Claims, 4 Drawing Sheets

(56) References Cited

U.S. PATENT DOCUMENTS

| | | | |
|---|---|---|---|
| 8,760,054 B2* | 6/2014 | DiVergilio | H01J 37/026 250/423 R |
| 2005/0057268 A1* | 3/2005 | Blalock | G01R 19/0046 29/846 |

* cited by examiner

BIPOLAR WAFER CHARGE MONITOR SYSTEM AND ION IMPLANTATION SYSTEM COMPRISING SAME

TECHNICAL FIELD

The present invention relates generally to ion implantation dose measurement systems and methods, and more specifically to a system for in-situ monitoring of negative and positive charge build-up on a workpiece.

BACKGROUND

In the semiconductor processing industry, ions are often implanted into a workpiece, such as a semiconductor wafer, in order to provide specific characteristics in the workpiece. One common process involves implanting ions into a workpiece, wherein transistor devices have been previously formed and isolated across the workpiece, and wherein a polysilicon contact is positioned over a gate of the device. The gate further overlays a so-called "well", wherein contacts to the well generally define source and drain contacts for the device, therein defining terminals of the device. A thin oxide further resides between the gate and the channel, wherein the contacts on either side of the gate define the source and drain. In operation, when a positive voltage is applied to the gate, such as in an n-channel transistor device, the positive voltage enhances or attracts negative charge and pushes out the positive charge, therein effectively cutting off conduction through the transistor. When the positive voltage is relaxed, charge is allowed to enter into the channel, therein permitting the transistor device to conduct.

When a positive voltage is applied to the gate that exceeds specifications for the oxide (e.g., a voltage that would create a relatively high electric field in the oxide on the order of 5-10 MV/cm), a current will generally start to flow through the oxide. Initially, current flows through the oxide via quantum-mechanical tunneling current (often referred to as Fowler-Nordheim or FN tunneling current) or direct tunneling, and the initial current flow typically produces no significant damage to the thin oxide, as little to no heat is initially produced during the initial flow of current. Over time, however, charge traps are generated by the current flow, thus eventually causing the oxide fail. A relatively large amount of charge (e.g., 1-3 coulombs/cm$^2$) is typically required to flow through the oxide before the oxide breaks down or fails.

The voltage at which current is initially conducted in a known, good, oxide is quite predictable. For example, for a given oxide thickness, the tunneling current is typically known, and can start at around 6-10V. During semiconductor processing, such as during an ion implantation process, it is desirable to determine whether the ion implantation will cause the device to reach the tunneling voltage, and if it does, whether current flow exists.

Conventionally, charge monitors have been utilized to measure the peak voltage that is impressed on the workpiece by an ion beam or ion implantation process. Such a peak voltage is commonly measured using a floating probe (e.g., a Langmuir probe). The floating probe is typically a planar probe (e.g., a small disc, approximately 1 mm in diameter), wherein when the probe is passed through the ion beam, it experiences either a positive or negative charging voltage, depending on whether there is an excess of ions or electrons in the beam. Typical charging voltages are in the range of +/−10V. In the small devices implemented in modern semiconductor processing, however, such charging voltages are often enough to induce a current to flow within the gate oxide structures.

Such a charging voltage inducing a current flow, however, does not necessarily indicate, by itself, that damage and/or break down is occurring within the device. Further, such a peak voltage measurement fails to provide enough information to determine whether damage to the device occurs, because as a general rule, the tunneling current is not damaging to the workpiece.

Another conventional methodology to monitor charges has been the use of consumable monitor wafers. Monitor wafers (also called test element group wafers) are comprised of semiconductor wafers having various capacitor structures formed thereon, wherein the capacitor structures have large contacts coupled thereto. The large areas of the contacts collect a relatively large amount of charge and focus it on a small capacitor gate. Various sizes of contact areas and gate areas for the gate contacts (e.g., the thin oxide), are provided, with the remainder of the device residing over a thick oxide layer. When a voltage is impressed across the monitor wafer, the flow of current in the device is focused onto the gate, itself. Various ratios of areas of contacts to areas of gates (called the "antenna ratio") are provided, and give a large current density in the gate, itself, such that the failure of the monitor devices is accelerated. Monitor wafers, however, are very expensive, and are used as a consumable or disposable test wafer for an implant.

Accordingly, a need exists for a new, more robust, and inexpensive bipolar measurement system and methodology for in-situ measuring of charge build-up during ion implantation.

SUMMARY

The present invention overcomes the limitations of the prior art by providing a system and method for in-situ measurement of charge build-up on a workpiece undergoing ion implantation. The present disclosure advantageously identifies whether a current flow and charge build-up exists, therein providing assistance in determining a longevity of particular devices undergoing processing. If current flow exists, identifying the degree to which current flows over time is further provided by the present disclosure. Accordingly, the following presents a simplified summary of the disclosure in order to provide a basic understanding of some aspects of the invention. This summary is not an extensive overview of the invention. It is intended to neither identify key or critical elements of the invention nor delineate the scope of the invention. Its purpose is to present some concepts of the invention in a simplified form as a prelude to the more detailed description that is presented later.

The use of conventional monitor wafers provides a qualitative measure of ion implantation system performance. However, this approach is limited, as it does not provide a meaningful indication of expected results on an actual device fabricated on a semiconductor workpiece. The present disclosure provides a significant improvement over conventional systems with actual measurements of the failure parameters that are considered most likely to cause an actual device to fail.

In the context of the present disclosure, one particular failure parameter focuses on a measurement of the total charge conducted through a thin oxide via a measurement system. As positive ions generate secondary electrons upon impact with a grounded surface (e.g., a workpiece), the measurement system of the present disclosure is operable to measure both positive and negative charge, as well as the accumulated magnitude thereof. Such secondary electrons are generally lost to the grounded surface in the area adjacent to the periphery of an ion beam, which, in turn, causes a rise in ion beam potential. Thus, charging will be positive near the center of the ion beam and negative near the edge of the ion beam. Accordingly, the present disclosure advantageously monitors and measures both positive and negative charge contributions separately in an ion implantation system.

In accordance with the present disclosure, an ion implantation system for implanting ions into a workpiece is provided. A process chamber is provided having an ion source configured to produce a plasma of ions or an ion beam within the process chamber. A workpiece support having a support surface configured to position the workpiece within an interior region of the process chamber is configured to expose an implantation surface of the workpiece to the plasma of ions or the ion beam. A charge monitor is further associated with the workpiece support, wherein a controller is configured to receive a signal from the charge monitor and to determine an amount of charge build-up experienced by the workpiece based, at least in part, on the signal from the charge monitor.

The charge monitor, according to one exemplary aspect, comprises a Langmuir probe, wherein a positive charge rectifier and a negative charge rectifier are operably coupled to the Langmuir probe and configured to pass only a positive charge and negative charge therethrough, respectively. A positive current integrator is operably coupled to the positive charge rectifier, wherein the positive current integrator is biased via a positive threshold voltage, and wherein the positive current integrator is configured to output a positive dosage based, at least in part, on the positive threshold voltage. A negative current integrator is operably coupled to the negative charge rectifier, wherein the negative current integrator is biased via a negative threshold voltage, and wherein the negative current integrator is configured to output a negative dosage based, at least in part, on the negative threshold voltage.

A positive charge counter and a negative charge counter are configured to respectively receive the output from the positive current integrator and the negative current integrator in order to provide a respective cumulative positive charge value and cumulative negative charge value associated with the respective positive charge and negative charge.

The above summary is merely intended to give a brief overview of some features of some embodiments of the present invention, and other embodiments may comprise additional and/or different features than the ones mentioned above. In particular, this summary is not to be construed to be limiting the scope of the present application. Thus, to the accomplishment of the foregoing and related ends, the invention comprises the features hereinafter described and particularly pointed out in the claims. The following description and the annexed drawings set forth in detail certain illustrative embodiments of the invention. These embodiments are indicative, however, of a few of the various ways in which the principles of the invention may be employed. Other objects, advantages and novel features of the invention will become apparent from the following detailed description of the invention when considered in conjunction with the drawings.

DETAILED DESCRIPTION

Figure 1:
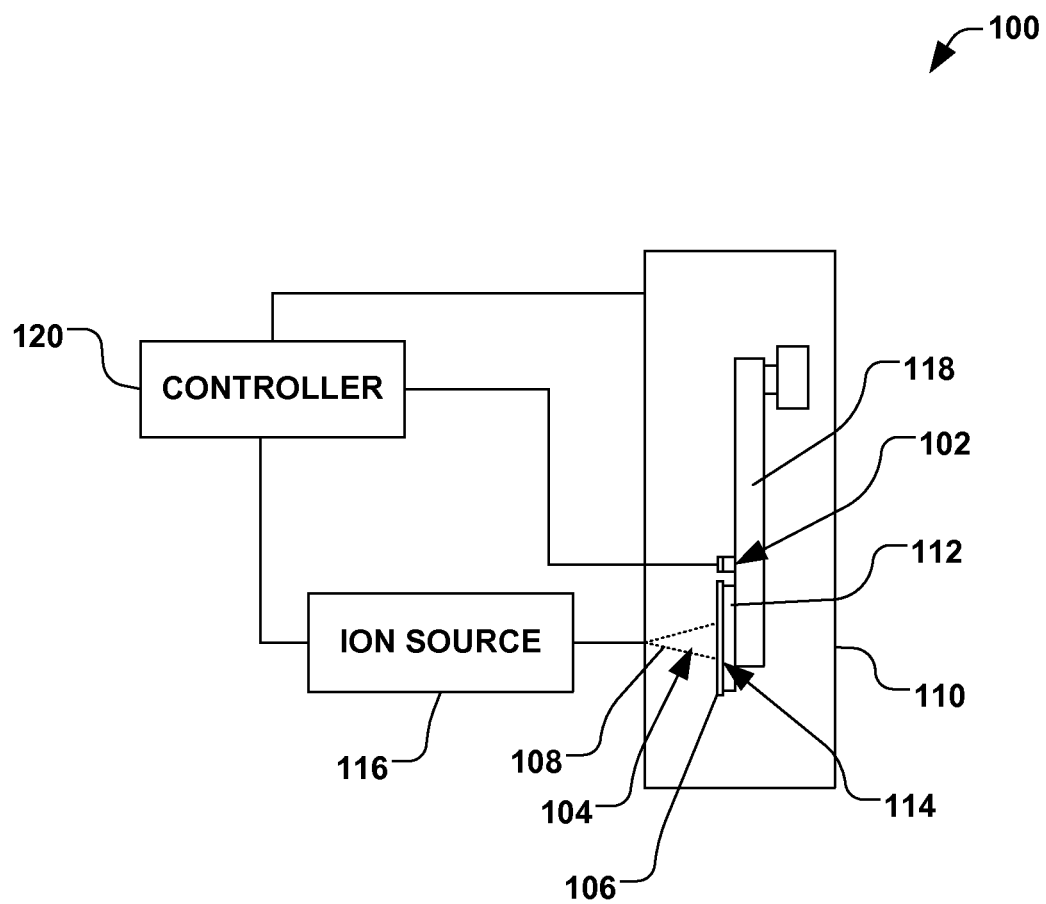
FIG. 1 is a block diagram of an ion implantation system according to several aspects of the present disclosure.

The present disclosure is directed generally toward a system, apparatus, and method for in-situ measuring and/or monitoring a charge build-up in a workpiece undergoing ion implantation. Accordingly, the present invention will now be described with reference to the drawings, wherein like reference numerals may be used to refer to like elements throughout. It will be understood that the description of these aspects are merely illustrative and that they should not be interpreted in a limiting sense. In the following description, for purposes of explanation, numerous specific details are set forth in order to provide a thorough understanding of the present invention. It will be evident to one skilled in the art, however, that the present invention may be practiced without these specific details. Further, the scope of the invention is not intended to be limited by the embodiments or examples described hereinafter with reference to the accompanying drawings, but is intended to be only limited by the appended claims and equivalents thereof.

It is also noted that the drawings are provided to give an illustration of some aspects of embodiments of the present disclosure and therefore are to be regarded as schematic only. In particular, the elements shown in the drawings are not necessarily to scale with each other, and the placement of various elements in the drawings has been chosen to provide a clear understanding of the respective embodiment and should not to be construed as necessarily being a representation of the actual relative locations of the various components in implementations according to an embodiment of the invention. Furthermore, the features of the various embodiments and examples described herein may be combined with each other unless specifically noted otherwise.

It is also to be understood that in the following description, any direct connection or coupling between functional blocks, devices, components, circuit elements or other physical or functional units shown in the drawings or described herein could also be implemented by an indirect connection or coupling. Furthermore, it is to be appreciated that functional blocks or units shown in the drawings may be implemented as separate features or circuits in one embodiment, and may also or alternatively be fully or partially implemented in a common feature or circuit in another embodiment. For example, several functional blocks may be implemented as software running on a common processor, such as a signal processor. It is further to be understood that any connection which is described as being wire-based in the following specification may also be implemented as a wireless communication, unless noted to the contrary.

Accordingly, the present disclosure provided hereafter describes a monitoring device, system, and method for monitoring charge build-up on a workpiece undergoing ion implantation. The present disclosure goes beyond merely measuring charging voltage, and advantageously measures an available amount of current at a given voltage, and integrates the available current over time, therein providing a total conductive charge experienced by the measurement device. One inventive aspect of the present disclosure is that statistically, the resultant total conductive charge experienced by the measurement device is analogous to the total conductive charge experienced by a standard, well-formed oxide formed on the workpiece. Thus, if the standard oxide will statistically withstand a predetermined conductive charge (e.g., 2 coulombs/cm$^2$) before it is damaged or breaks down, the present disclosure provides a measurement device to determine, for a particular ion implantation, the charging capability of the ion beam. If the charging capability is less than predetermined conductive charge, then a prediction can be made regarding an expected longevity of the oxide layer (e.g., where the oxide layer is positioned on a known oxide wear-out curve or Weibull curve).

Referring now to the figures, FIG. 1 illustrates an exemplary ion implantation system 100 employing a charge monitor 102 (e.g., also called a bipolar charge monitor). The ion implantation system 100 is configured to produce a plasma of ions 104, wherein the ions are implanted into a workpiece 106. The ion implantation system 100, in one example, is configured to produce an ion beam 108, wherein the ions 104 are directed toward the workpiece 106 using known techniques. Alternatively, the ion implantation system 100 comprises a plasma immersion ion implantation (PIII) system (not shown) or any other ion implantation system capable of producing a plurality of ions 104 for implantation into the workpiece 106. Thus, the present invention is not limited to a particular ion implantation system 100 (e.g., beam-based, plasma-based, etc.), and is believed to have utility in most all implantation systems configured to implant ions into workpieces 106.

As illustrated, the ion implantation system 100 comprises a process chamber 110, wherein a workpiece support 112 is generally positioned within process chamber. The workpiece support 112, for example, is configured to provide a surface for holding the workpiece 106, such as a semiconductor wafer (e.g., a silicon wafer). The workpiece support 112, for example, comprises an electrostatic chuck or a mechanical clamping apparatus (not shown) configured to electrostatically or mechanically clamp the workpiece 106 to a support surface 114 of the workpiece support. It should be noted that while the workpiece support 112 is described in the present example as supporting one workpiece 106, various other configurations are also contemplated, such as a configuration to concurrently support a plurality of workpieces.

In accordance with one example, an ion source 116 is provided, wherein the ion source is configured to produce and supply a plasma of ions 104 to the process chamber 110, and thus, to the workpiece 106 residing on the workpiece support 112. In the present example, the plasma of ions 104 comprises the ion beam 108, wherein the ion source 116 represents various components configured to mass analyze, shape, and form the ion beam, as will be appreciated by one of ordinary skill in the art. It is noted that various gases, energies, techniques, and/or other apparatuses known for producing a plasma of ions 104, whether in the form of an ion beam, a plasma shower, or other plasma, can be utilized in accordance with the present disclosure, as all such gases, techniques, and/or apparatus are contemplated as falling within the scope of the present invention.

A well-known problem in the field of ion implantation systems occurs as a result of the ions striking the wafer or workpiece surface: low energy electrons are emitted and the wafer tends to become positively charged. Generally, the net amount of positive charge delivered to the wafer will be directly proportional to the beam current. When the wafer surface is well grounded and is free of dielectric layers, this charge mainly flows to ground. However, during the course of semiconductor manufacturing, ions are typically implanted after one or more dielectric layers have already been formed on the surface of the workpiece. These layers act as isolated islands on which the ion beam creates electrostatic charge.

This charge buildup creates various problems. For example, the electrostatic charge interacts with the beam and causes it to lose density, which results in an undesirable nonuniform implantation process. More importantly, electrostatic charge can build up and discharge, which may damage and/or destroy the already formed dielectric layers on the wafer. With smaller size integrated circuits, the susceptibility of dielectric layers to destruction by such discharge increases. Hence, there is low tolerance for surface charge buildup during ion implantation process.

A solution to these problems is to introduce a neutralizing charge, e.g electrons, via an electron source, to the beam and/or to the surface of the wafer before the beam contacts the wafer. Various solutions to wafer charging whereby a neutralizing charge can be applied in proximity to where the beam contacts the wafer have been presented, as can be found, for example, in commonly assigned U.S. Pat. Nos. 7,800,083 and 8,760,054, among others, which patents will be incorporated by reference herein. As will be seen, the present invention is directed to a bipolar charge monitoring device and system for measuring positive ion charge as well as negative electron charge received at the wafer. This bipolar charge monitoring system can be used to make quantitative measurement of charge buildup, which, in turn, can be used to provide feedback to the electron source to vary the electron output thereof.

In accordance with one exemplary aspect of the disclosure, a scan arm 118 is provided within the process chamber 110, wherein the scan arm is configured to selectively translate the workpiece support 112, and thus, the workpiece 106, through the ion beam 108. A controller 120 is further provided to control overall operation of the ion implantation system 100. For example, the controller 120 is configured to individually and/or collectively control the ion source 116, movement of the workpiece 106 within the process chamber 110, the charge monitor 102, as well as other apparatus and/or conditions associated with the ion implantation system 100.

Figure 2:
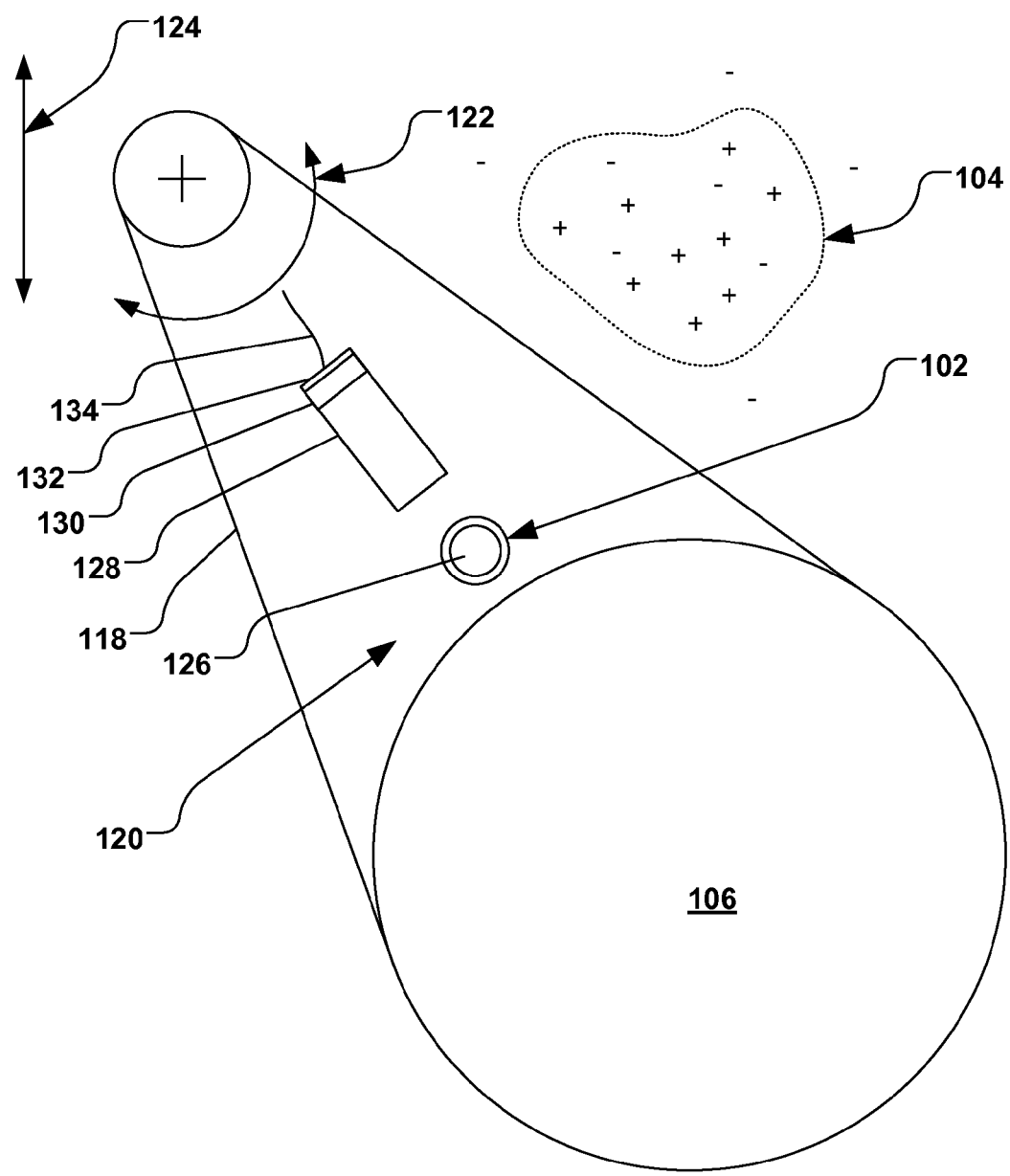
FIG. 2 illustrates a scan arm having a charge monitor disposed thereon in accordance with one exemplary aspect of the disclosure.

In the case of scanning the workpiece 106 through the ion beam 108 via the scan arm 118, the charge monitor 102 is positioned on the scan arm such that the charge monitor is in an over-scan region 120, as illustrated in greater detail in FIG. 2. The over-scan region 120, for example, comprises a portion of the scan arm 118 that passes through the ion beam 108 during a rotation 122 and/or translation 124 of the scan arm, wherein the charge monitor 102 receives the same dose from the ion beam 108 as a formed semiconductor device (not shown) of similar area on workpiece 106. In accordance with one example of the present disclosure, the scan arm 118 of FIG. 2 oscillates back and forth (e.g., via the rotation 122) through the ion beam 108 while it is translated (e.g., via the translation 124), thus passing both the workpiece 106 and charge monitor 102 through the ion beam 108 many times. In one example, the ion beam 108 is much larger than the vertical scan pitch, thus causing the implant to uniformly cover all points on the workpiece 106 and the charge monitor 102 located in the periphery.

In accordance with the present disclosure, the charge monitor 102 comprises a planar Langmuir probe 126. The Langmuir probe 126, for example, is further operably coupled to the controller 120 via suitable wiring and/or feed-thru cabling (not shown). In another example, the charge monitor 102 is powered via one or more batteries 128 and configured to communicate to the controller 120 via a non-electrically conductive signal transmitter 130 associated with therewith. Thus, the charge monitor 102 is controlled while generally preventing stray capacitance associated with the communication of the signal. Such an arrangement is particularly useful in a plasma ion immersion system (not shown), wherein the plasma of ions 104 is pulsed, and electrical connections to the workpiece support 112 are desirably minimized to avoid deleterious capacitance issues. In one example, the non electrically-conductive signal transmitter 130 comprises a fiber optic signal transmitter 132, wherein the signal is communicated to the controller 120 via a fiber optic cable 134. Alternatively, the non electrically-conductive signal transmitter 132 comprises a wireless transmitter (not shown), wherein the signal is communicated to the controller via the wireless transmitter to a wireless receiver (not shown) associated with the controller 120. The one or more batteries 128, for example, are configured to be recharged during one or more of a transfer or exchange of workpieces 106 to or from the process chamber 110 and vacuum recovery periods.

Figure 3:
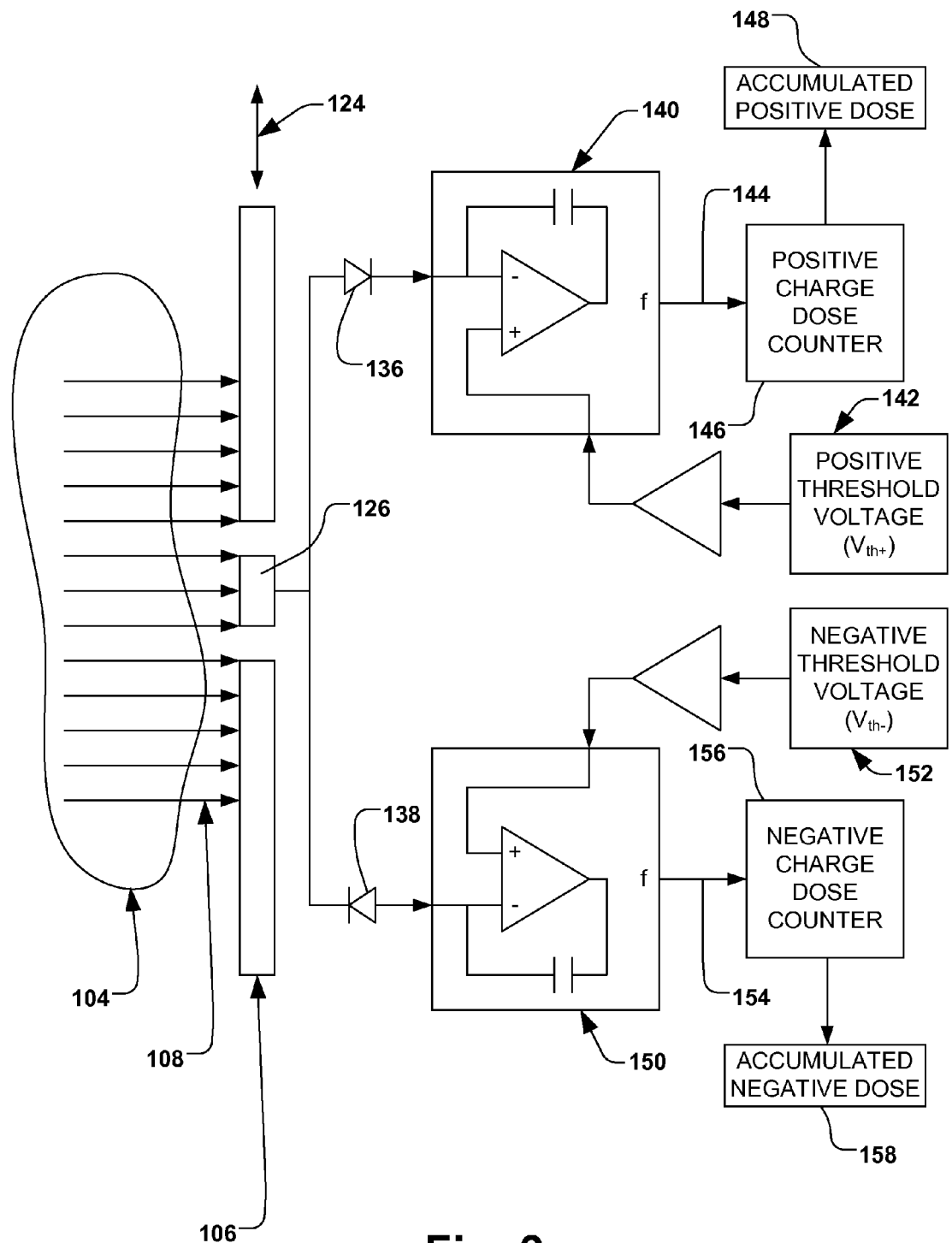
FIG. 3 illustrates a schematic diagram of an ion implantation charge monitor system in accordance with one example of the disclosure.

As illustrated schematically in FIG. 3, the Langmuir probe 126 is electrically coupled to a positive charge rectifier 136 (e.g., a diode), wherein the positive charge rectifier is configured to pass only a positive charge therethrough. The Langmuir probe 126 is further electrically coupled to a negative charge rectifier 138 (e.g., a diode), wherein the negative charge rectifier is configured to pass only a negative charge therethrough. A positive current integrator 140 is further provided, wherein the positive current integrator is operably coupled to the positive charge rectifier 136, and wherein the positive current integrator is biased via a positive threshold voltage 142 (also denoted as $V_{th+}$). Accordingly, the positive current integrator 140 is configured to output a positive dosage 144 based, at least in part, on the positive threshold voltage 142. A positive charge counter 146 is configured to receive the output from the positive current integrator 140 and to provide a cumulative positive charge value 148 associated with the accumulated positive charge experienced by the Langmuir probe 126.

Likewise, a negative current integrator 150 is operably coupled to the negative charge rectifier 138, wherein the negative current integrator is biased via a negative threshold voltage 152 (also denoted as $V_{th-}$), and wherein the negative current integrator is configured to output a negative dosage 154 based, at least in part, on the negative threshold voltage. Accordingly, a negative charge counter 156 is provided and configured to receive the output negative dosage 154 from the negative current integrator 150 and to provide a cumulative negative charge value 158 associated with the negative charge experienced by the Langmuir probe 126.

The positive and negative current integrators 140 and 150, for example, are biased separately using variable positive and negative threshold voltages 142 and 152, thus serving to block low voltage sources that do not meet a predefined threshold. The variable positive and negative threshold voltages 142 and 152, for example, are determined and set based, at least in part, on the gate oxide thickness and polarity of the formed devices on the workpiece 106. Once an ion implantation into the workpiece 106 is complete, the positive and negative charge counters 146 and 156 (e.g., 16-bit digital counters) will thus have stored in their registers a value equivalent to the conducted charge for positive and negative current, in units of coulombs per $cm^2$, which is a true measure of charging at constant voltage. Once an ion implantation is completed, the cumulative positive and negative charge values 148 and 158 can be utilized to predict the conducted charge through the devices (not shown) on the workpiece 106.

Figure 4:
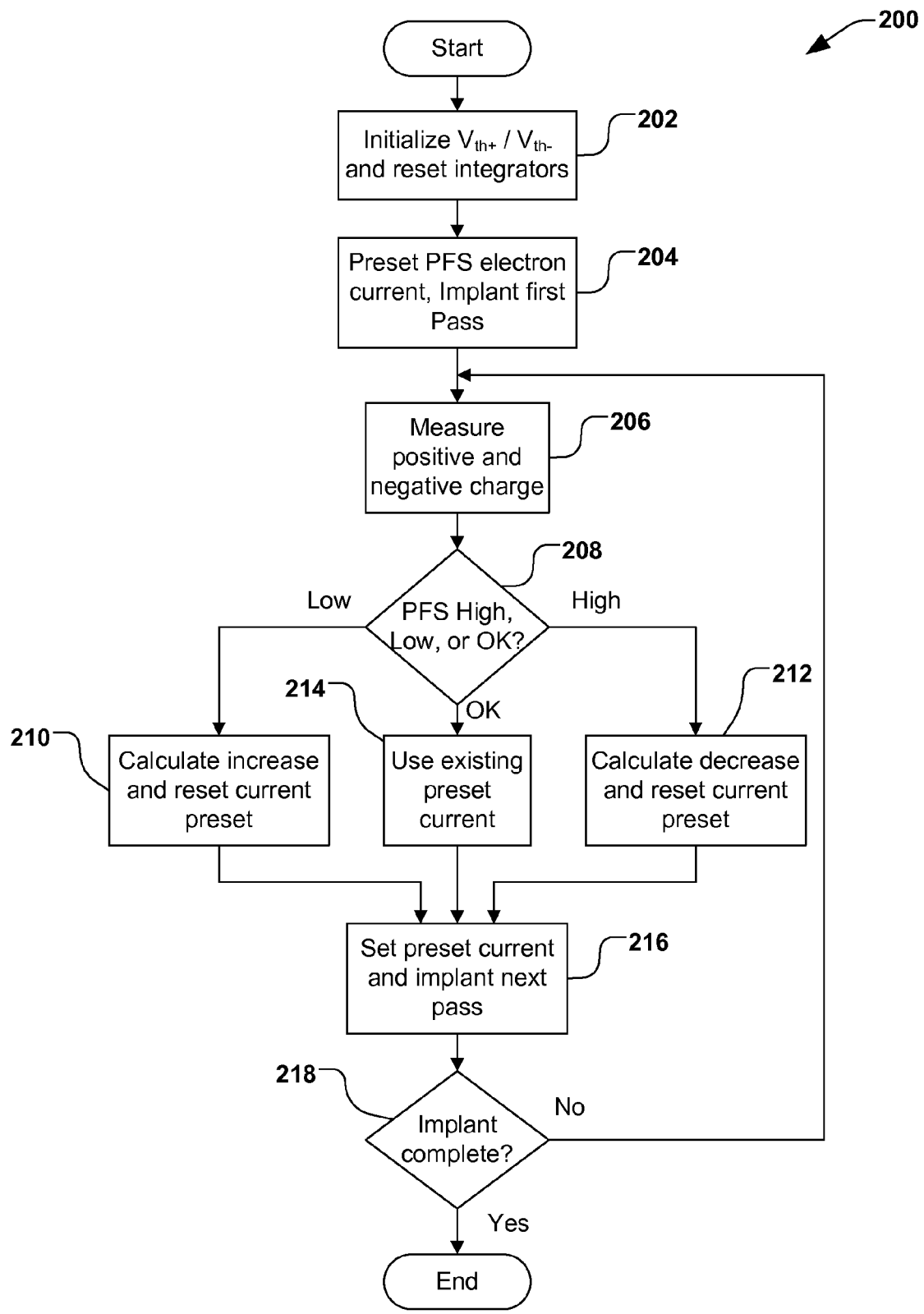
FIG. 4 illustrates a methodology for monitoring a build-up of charge on a workpiece during an ion implantation according to still another aspect of the present disclosure.

In accordance with another exemplary aspect of the invention, FIG. 4 illustrates an exemplary method 200 for monitoring charge build-up during an implantation of ions into a workpiece. It should be noted that while exemplary methods are illustrated and described herein as a series of acts or events, it will be appreciated that the present invention is not limited by the illustrated ordering of such acts or events, as some steps may occur in different orders and/or concurrently with other steps apart from that shown and described herein, in accordance with the invention. In addition, not all illustrated steps may be required to implement a methodology in accordance with the present invention. Moreover, it will be appreciated that the methods may be implemented in association with the systems illustrated and described herein as well as in association with other systems not illustrated.

The method 200 of FIG. 4 begins at act 202, wherein positive and negative threshold voltages $V_{th+}$ and $V_{th-}$, as well as positive and negative integrators are initialized. In act 204, current of an electron source, such as a plasma flood source (PFS) is set to predetermined preset value, and a workpiece is implanted with ions by passing the workpiece through an ion beam. For example, the workpiece is held on a workpiece support.

In act 206, positive and negative charge is measured via the charge monitor 102 of FIG. 1, for example, wherein the charge monitor experiences both electron and ion impingement in different proportions depending on the spatial relationship between the charge monitor and the ion beam 108. As previously discussed, the ion beam 108 is made up mostly of electrons about the periphery of the ion beam, as well as ions at the center of the beam. Accordingly, the charge monitor 102 experiences negative charging as it approaches the edge of the ion beam 108, positive charging as it passes through the ion beam, and negative charging once again as it transitions to, and leaves, the opposing edge of the ion beam.

Upon viewing the present disclosure, those of skill in the art will understand that the electrical current arriving at a Langmuir probe 126 of FIG. 2, for example, is a function of the voltage difference between the Langmuir probe and the plasma of ions 104 associated with the ion beam 108 of FIG. 1. Both ions and electrons having sufficient kinetic energy will strike the charge monitor 102, yielding a net current thereto. When the charge monitor 102 reaches a negative potential sufficient to repel all incoming electrons, it will measure only total ion current from the ion beam 108. On the other hand, when the charge monitor 102 reaches a positive potential sufficient to repel all incoming ions, it will measure only total electron current from the incoming ion beam 108. These so-called "saturation levels" define the limits between which the charge monitor 102 is set to operate, whereby the charge monitor collects a mix of ions and electrons. For example, saturation levels are analogous to the breakdown voltages associated with capacitive structures built on the workpiece 106 during the semiconductor manufacturing process.

Thus, the method 200 of FIG. 4 enables measurement and monitoring of these saturation levels as preset threshold values measured by the charge monitor 102 of FIG. 1, such that the implant process is carried out between the appropriate parameters, and wherein the cumulative effects of energetic charges flowing through dielectric layers on the workpiece 106 will not cause damaging displacement of current flows therethrough.

Upon viewing the present disclosure, it will be understood that the bipolar charge monitor 102 provides a measurement of the cumulative effects of wafer charging during each wafer scan, whereby the measurement can be used to adjust the electron source and the wafer charging induced thereby. Preset input parameters are provided to the controller 120 of FIG. 1 based on predicted values of breakdown voltages associated with the devices being fabricated on the workpiece 106. Thus, in act 208 of FIG. 4, the cumulative effects of the wafer charging are processed: if the negative charge is too low, an increase in electron output is determined and a new preset threshold signal is transmitted to the electron source to increase the electron output thereof (e.g., in act 210); if the negative charge is too high, a decrease in electron output is determined and a new preset threshold signal is transmitted to the electron source to decrease the electron output thereof (e.g., in act 212); and if the negative charge is determined to be within a satisfactory range, the electron source output is determined to be satisfactory and the preset threshold signal is maintained as the input control signal to the electron source to maintain the electron output thereof (e.g., in act 214). Thereafter, the results of this processing step are transmitted to the electron source (e.g., via the controller 120 of FIG. 1) and a successive implant scan is carried out in act 216 using the new preset electron output of the electron source. This processing step can be carried out multiple times over a plurality of implant scans until the appropriate implant dosage is complete (e.g., in act 218).

Accordingly, the electron source (a plasma flood source PFS) is adjusted to control a target charge neutralization level as measured by the bipolar charge monitor. This may be a balance of charge for each polarity, or one that is imbalanced on one side or the other. The adjustment, for example, advantageously occurs at the end of each implant pass until the desired number of implant passes has been completed.

Although the invention has been shown and described with respect to a certain embodiment or embodiments, it should be noted that the above-described embodiments serve only as examples for implementations of some embodiments of the present invention, and the application of the present invention is not restricted to these embodiments. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application. Accordingly, the present invention is not to be limited to the above-described embodiments, but is intended to be limited only by the appended claims and equivalents thereof.

What is claimed is:

1. A charge monitor for an ion implantation system, the charge monitor comprising:
   a Langmuir probe;
   a positive charge rectifier operably coupled to the Langmuir probe and configured to pass only a positive charge therethrough;
   a positive current integrator operably coupled to the positive charge rectifier, wherein the positive current integrator is biased via a positive threshold voltage, and wherein the positive current integrator is configured to output a positive dosage based, at least in part, on the positive threshold voltage;
   a positive charge counter configured to receive the output from the positive current integrator and to provide a cumulative positive charge value associated with the positive charge;
   a negative charge rectifier operably coupled to the Langmuir probe and configured to pass only a negative charge therethrough;
   a negative current integrator operably coupled to the negative charge rectifier, wherein the negative current integrator is biased via a negative threshold voltage, and wherein the negative current integrator is configured to output a negative dosage based, at least in part, on the negative threshold voltage; and
   a negative charge counter configured to receive the output from the negative current integrator and to provide a cumulative negative charge value associated with the negative charge.

2. The charge monitor of claim 1, wherein the Langmuir probe is positioned along a plane of the workpiece on a scanning arm configured to scan the workpiece through an ion beam.

3. The charge monitor of claim 1, wherein the Langmuir probe is generally planar and is generally coplanar with an implantation plane of a workpiece.

4. The charge monitor of claim 1, further comprising a non electrically-conductive signal transmitter associated with the Langmuir probe, wherein the signal from the Langmuir probe is communicated to the controller via the non electrically-conductive signal transmitter, therein generally preventing stray capacitance associated with the communication of the signal.

5. The charge monitor of claim 4, wherein the non electrically-conductive signal transmitter comprises a fiber optic signal transmitter, wherein the signal is communicated to the controller via a fiber optic cable.

6. The charge monitor of claim 4, wherein the non electrically-conductive signal transmitter comprises a wireless transmitter, wherein the signal is communicated to the controller via the wireless transmitter to a wireless receiver associated with the controller.

7. The charge monitor of claim 1, wherein the charge monitor comprises a battery, wherein the charge monitor is generally powered by the battery.

8. The charge monitor of claim 7, further comprising a recharging unit, wherein the recharging unit is selectively electrically connected to the battery of the charge monitor, and wherein the recharging unit is configured to recharge the battery when electrically connected thereto.

* * * * *